United States Patent
Zheng

(10) Patent No.: US 9,810,955 B2
(45) Date of Patent: Nov. 7, 2017

(54) ARRAY SUBSTRATE AND DISPLAY DEVICE

(71) Applicant: Shenzhen China Star Optoelectronics Technology Co., Ltd., Shenzhen, Guangdong (CN)

(72) Inventor: Hua Zheng, Guangdong (CN)

(73) Assignee: Shenzhen China Star Optoelectronics Technology Co., Ltd., Shenzhen Guangdong (CN)

( * ) Notice: Subject to any disclaimer, the term of this patent is extended or adjusted under 35 U.S.C. 154(b) by 0 days.

(21) Appl. No.: 14/417,842

(22) PCT Filed: Jan. 13, 2015

(86) PCT No.: PCT/CN2015/070626
§ 371 (c)(1),
(2) Date: May 9, 2016

(87) PCT Pub. No.: WO2016/078208
PCT Pub. Date: May 26, 2016

(65) Prior Publication Data
US 2016/0246123 A1   Aug. 25, 2016

(30) Foreign Application Priority Data
Nov. 17, 2014   (CN) .......................... 2014 1 0655385

(51) Int. Cl.
*G02F 1/1343*  (2006.01)
*G02F 1/1335*  (2006.01)
(Continued)

(52) U.S. Cl.
CPC ...... *G02F 1/134309* (2013.01); *G02F 1/1362* (2013.01); *G02F 1/1368* (2013.01);
(Continued)

(58) Field of Classification Search
None
See application file for complete search history.

(56) References Cited

U.S. PATENT DOCUMENTS 7,224,414 B2 *   5/2007   Sakamoto ......... G02F 1/133512
349/44
2005/0140903 A1 *   6/2005   Park .................. G02F 1/134363
349/141
(Continued)

FOREIGN PATENT DOCUMENTS

CN   1637558 A   7/2005
CN   103048836 A   4/2013
(Continued)

OTHER PUBLICATIONS

International Search Report and Written Opinion, Jan. 13, 2015, China.

*Primary Examiner* — Ryan Crockett
(74) *Attorney, Agent, or Firm* — Kim Winston LLP

(57) ABSTRACT

An array substrate comprising a plurality of sub-pixel unit pairs and a display device are provided. Each sub-pixel unit pair comprises two adjacent sub-pixel units located in a same row. Two sub-pixel units in a same sub-pixel unit pair are mirror-symmetrical with respect to each other in structure, and a first common electrode forming an opaque region is arranged between said two sub-pixel units.

8 Claims, 8 Drawing Sheets

(51) Int. Cl.
*G02F 1/1362* (2006.01)
*G02F 1/1368* (2006.01)
*H01L 27/12* (2006.01)

(52) U.S. Cl.
CPC .... *G02F 1/13439* (2013.01); *G02F 1/133509* (2013.01); *G02F 1/133512* (2013.01); *G02F 1/133514* (2013.01); *G02F 1/136286* (2013.01); *H01L 27/124* (2013.01); *G02F 2001/134318* (2013.01); *G02F 2001/134345* (2013.01)

(56) References Cited

U.S. PATENT DOCUMENTS

| | | |
|---|---|---|
| 2005/0151910 A1 | 7/2005 | Park et al. |
| 2006/0139516 A1* | 6/2006 | Park .................. G02F 1/133512 349/110 |
| 2013/0021551 A1* | 1/2013 | Yu ..................... G02F 1/134363 349/43 |

FOREIGN PATENT DOCUMENTS

| | | |
|---|---|---|
| CN | 203277384 U | 11/2013 |
| JP | 2009122212 A | 6/2009 |

* cited by examiner

ARRAY SUBSTRATE AND DISPLAY DEVICE

The present application claims benefit of Chinese patent application CN 201410655385.5, entitled "An Array Substrate and A Display device" and filed on Nov. 17, 2014, the entirety of which is incorporated herein by reference.

TECHNICAL FIELD

This disclosure relates to the technical field of display, and in particular to an array substrate and a display device.

TECHNICAL BACKGROUND

A vertical alignment (VA) display device is widely used due to the advantages of high contrast ratio, wide viewing angle, and the like. Generally, the VA display device comprises an array substrate and a color filter substrate. Gate lines and data lines arranged in a staggered manner with respect to each other and sub-pixel units formed by the gate lines and the data lines are disposed on the array substrate. Color filter corresponding to the sub-pixel units, and black matrix corresponding to the gate lines and the data lines, are formed on the color filter substrate. The array substrate and the color filter substrate are assembled together, and liquid crystal molecules are packaged therein, thereby a liquid crystal panel of the display device is formed. An electric field is formed between the array substrate and the color filter substrate. The liquid crystal molecules are controlled to deflect through adjusting the intensity of the electric field, so that the intensity of light passing through the liquid crystal molecule layer can be changed. Light with different intensities coordinates with the color filter on the color filter substrate, so that the display device can display color images.

Since the array substrate and the color substrate are fixed together through a frame around all four sides thereof, relative shift would easily occur to a display region. Due to the relative shift, the black matrix of the color filter substrate may fail to effectively cover light-leaking regions around the data lines of the array substrate. As a result, an undesirable display defect of "light-leakage on a black image which is in a vertical direction of a bright image" would occur. Generally, this undesirable display effect is named as vertical crosstalk (V-crosstalk).

Specifically, the principle of V-crosstalk caused by the relative shift between the array substrate and the color filter substrate of the liquid crystal panel is as shown in FIGS. 1-5. FIG. 1 schematically shows a structure of a sub-pixel unit 1 of an array substrate formed through a five-time patterning process. When a data signal transmitted through a data line 4 of the sub-pixel unit 1 is low bias voltage all the time (as shown in FIG. 2), liquid crystals on both sides of the data line 4 will not deflect (as shown in FIG. 3), and therefore the light-leaking regions will not be formed. When the data signal transmitted through the data line 4 is alternately high bias voltage and low bias voltage (as shown in FIG. 4), the liquid crystals on both sides of the entire data line 4 will deflect in the case that the signal transmitted through the data line 4 is high bias voltage, thereby forming light-leaking regions (as shown in FIG. 5).

Under ideal conditions, in order to realize a maximum aperture ratio of the sub-pixel unit 1 (namely the ratio of an area of an aperture region, which permits light to pass through, to that of the entire sub-pixel unit 1), it is expected that a black matrix 5 can block exactly to an edge of a pixel electrode 9 of the sub-pixel unit 1 (as shown in FIG. 6).

However, in order to avoid V-crosstalk, the black matrix 5 is usually widened, so that it further extends towards a center of the pixel electrode 9 for a distance X1 (as shown in FIG. 7). The value of X1 depends on the degree of the relative shift between the array substrate and the color filter substrate, and the degree of the relative shift depends on specific conditions of the liquid crystal panel comprising the array substrate and the color filter substrate. The degree of the relative shift is usually in a range of 0-30 micrometers. The higher the degree of the relative shift is, the higher the probability of V-crosstalk. Generally, the value of X1 is in a range of 2-20 micrometers, and the higher the value of X1 is, the larger loss of the aperture ratio. However, with respect to an ordinary sub-pixel unit 1 (as shown in FIG. 8), since data lines 4 are arranged on both sides of the pixel electrode 9, the area loss of an aperture region in each sub-pixel unit is $2 \times X1 \times H1$ (H1 is an effective height of the aperture region), thereby causing large loss of aperture ratio. Consequently, the display effect and the light emergent effect of the display device will be influenced.

SUMMARY OF THE INVENTION

The present disclosure aims to provide an array substrate and a display device, so that light-leakage can be prevented while the aperture ratio of the display device is guaranteed.

In a first aspect according to the present disclosure, an array substrate is provided. The array substrate comprises a plurality of sub-pixel unit pairs, each sub-pixel unit pair comprising two adjacent sub-pixel units located in a same row, wherein two sub-pixel units in a same sub-pixel unit pair are mirror-symmetrical with respect to each other in structure, and a first common electrode forming an opaque region is arranged between said two sub-pixel units.

Each sub-pixel unit further comprises a thin film transistor located in a corner of the sub-pixel unit pair, and a data line is disposed between two adjacent sub-pixel units.

Each sub-pixel unit comprises a pixel electrode, and both pixel electrodes of two sub-pixel units in a same sub-pixel unit pair partially overlap the first common electrode.

Each sub-pixel unit further comprises a second common electrode that is parallel to the first common electrode, and located on an other side of the pixel electrode, the second common electrode partially overlapping the pixel electrode.

Each sub-pixel unit further comprises a metal wiring which electrically connects the second common electrode with the first common electrode.

The array substrate further comprises a plurality of gate lines for providing drive signal to the thin film transistor of the sub-pixel unit, wherein the plurality of gate lines are perpendicular to the data lines, and each are disposed between two rows of pixel units, and the first common electrode and the gate lines are located on a same layer and insulated with each other.

The present disclosure has the following beneficial effects. In a technical solution according to the present disclosure, an opaque region formed by the first common electrode corresponds exactly to a region between two sub-pixel units, so that a light-leaking region can be prevented from being formed between said two sub-pixel units in the same sub-pixel unit pair. Meanwhile, since both the first common electrode and the sub-pixel units are disposed on the array substrate, sufficient light shielding effect of the first common electrode on the two sub-pixel units of the same sub-pixel unit pair can be guaranteed. Therefore, an original width of a black matrix disposed on a color filter substrate opposite to the array substrate and corresponding to the region between the two sub-pixel units in the same sub-pixel unit pair can remain the same or be reduced, thereby an aperture ratio of the sub-pixel unit can be improved effectively.

In another aspect according to the present disclosure, a display device is further provided. The display device comprises the aforementioned array substrate and the color filter substrate coordinating with the array substrate.

The color filter substrate comprises a black matrix, which comprises a first region corresponding to data lines of the array substrate, and a second region adjoining the first region and corresponding to gate lines of the array substrate.

The first region partially covers a pixel electrode of a corresponding sub-pixel unit.

A coverage width of the first region over the pixel electrode of the sub-pixel unit is in a range of 2-20 micrometers.

Other features and advantages of the present disclosure will be further explained in the following description, and are partially become more readily evident therefrom, or be understood through implementing the present disclosure. The objectives and advantages of the present disclosure will be achieved through the structure specifically pointed out in the description, claims, and the accompanying drawings.

BRIEF DESCRIPTION OF THE DRAWINGS

In order to illustrate the technical solutions of the examples of the present disclosure more clearly, the accompanying drawings needed for describing the examples will be explained briefly. In the drawings.

DETAILED DESCRIPTION OF THE EMBODIMENTS

The present disclosure will be explained in detail with reference to the embodiments and the accompanying drawings, whereby it can be fully understood about how to solve the technical problem by the technical means according to the present disclosure and achieve the technical effects thereof, and thus the technical solution according to the present disclosure can be implemented. It is important to note that as long as there is no structural conflict, various embodiments as well as the respective technical features mentioned herein may be combined with one another in any manner, and the technical solutions obtained all fall within the scope of the present disclosure.

Example 1

Figure 9:
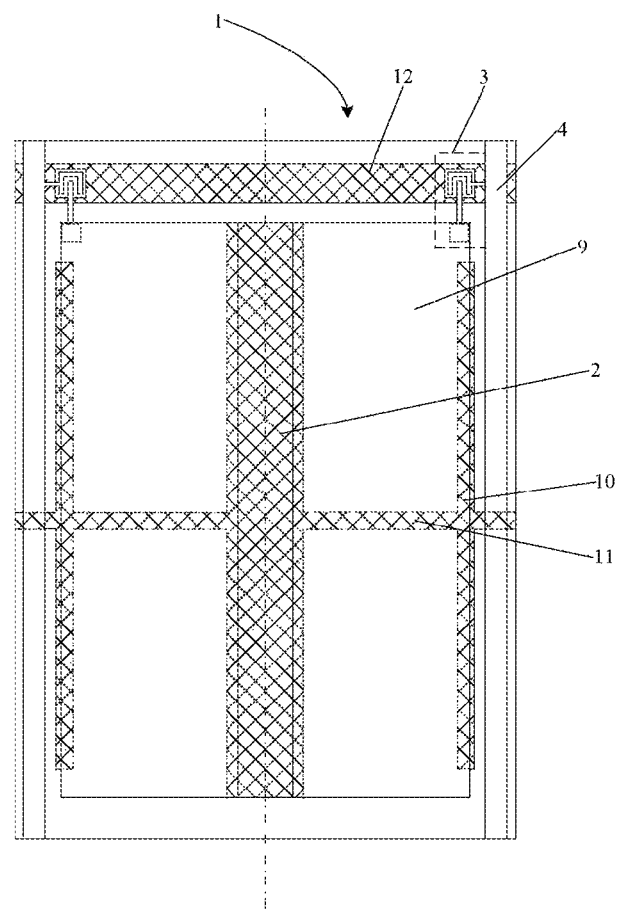

According to the present example, an array substrate is provided. As shown in FIG. 9, the array substrate comprises a plurality of sub-pixel unit pairs, each comprising two adjacent sub-pixel units 1 located in a same row.

Specifically, two sub-pixel units in a same sub-pixel unit pair are mirror-symmetrical with respect to each other in structure, with a dotted line in FIG. 9 being an axis of symmetry. A first common electrode 2 forming an opaque region is arranged between said two sub-pixel units 1.

Obviously, in a technical solution according to an example of the disclosure, the opaque region formed by the first common electrode corresponds exactly to a region between the two sub-pixel units, so that a light-leaking region between two sub-pixel units in the same sub-pixel unit pair can be prevented. Meanwhile, since both the first common electrode and the sub-pixel units are arranged on the array substrate, the light shielding effect of the first common electrode over the two sub-pixel units in the same sub-pixel unit pair can be guaranteed. Therefore, an original width of a black matrix disposed on a color filter substrate opposite to the array substrate and corresponding to the region between the two sub-pixel units in the same sub-pixel unit pair can remain the same or be reduced, whereby an aperture ratio of the sub-pixel unit can be improved effectively.

Further, each sub-pixel unit 1 of the array substrate comprises a thin film transistor 3, and a data line 4 for providing data signal to the thin film transistor 3. Since two sub-pixel units 1 in each sub-pixel unit pair are mirror-symmetrical with respect to each other, each thin film transistor 3 can be disposed in a corner of the sub-pixel unit pair, and then a corresponding data line 4 is disposed between two adjacent sub-pixel unit pairs, in order to facilitate the configuration of the first common electrode 2. Two data lines 4 are respectively disposed on both sides of each sub-pixel unit pair.

Figure 10:
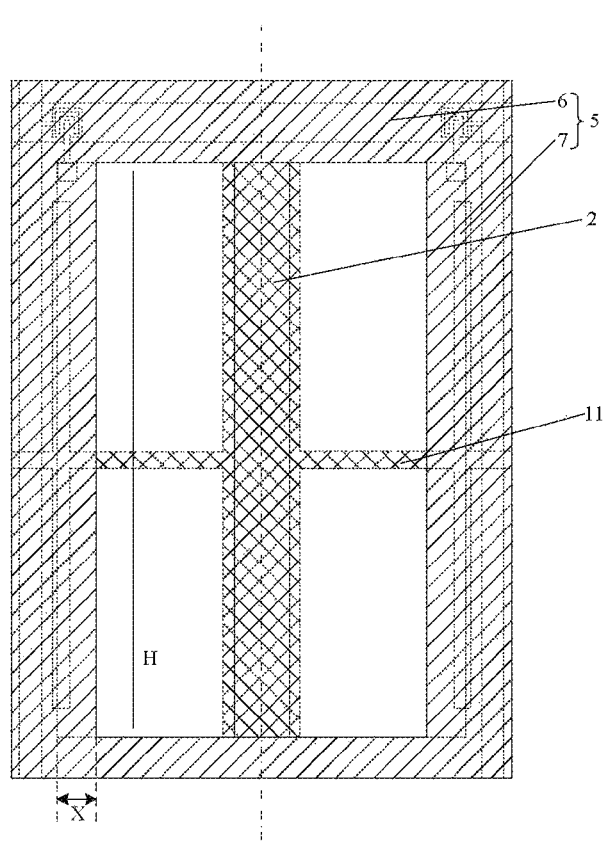
Figure 11:
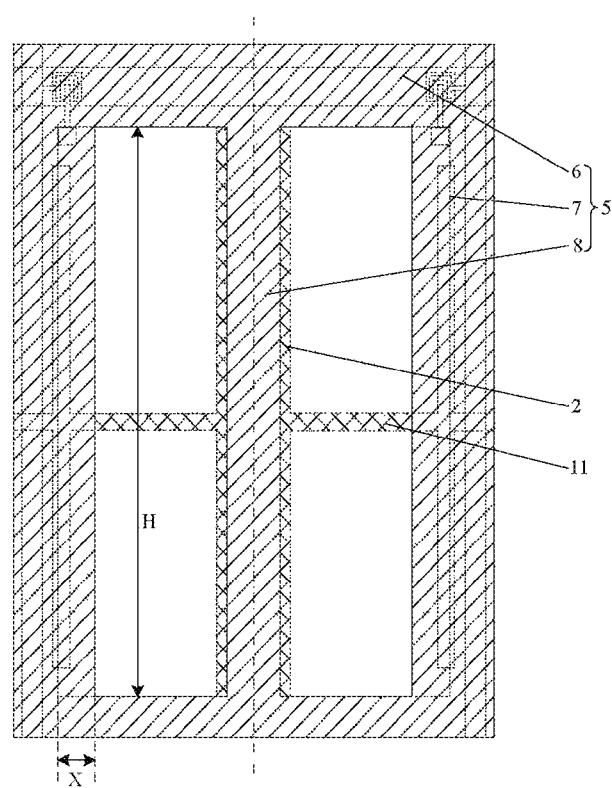

Specifically, as shown in FIG. 9, the data line 4 for providing data signal to the thin film transistor 3 of the sub-pixel unit 1 on the left can be disposed on a left side of the sub-pixel unit pair. Correspondingly, the thin film transistor 3 of the sub-pixel unit 1 on the left can be disposed on an upper left corner or a bottom left corner thereof. The data line 4 for providing data signal to the sub-pixel unit 1 on the right can be disposed on a right side of the sub-pixel unit pair. Correspondingly, the thin film transistor 3 of the sub-pixel unit 1 on the right can be disposed on an upper right corner or a bottom right corner thereof As shown in FIG. 10, a black matrix 5 is disposed on the color filter substrate which is assembled with the array substrate. The black matrix 5 comprises a first region 6 corresponding to the data lines 4 of the array substrate and a second region 7 adjoining the first region 6. In addition, as shown in FIG. 11, the black matrix 5 further comprises a third region 8 corresponding to the first common electrode 2. Since no data line 4 is disposed within the same sub-pixel unit pair, and the first common electrode 2 between two sub-pixel units 1 in the same sub-pixel unit pair can shield the light, the third region 8 can have any suitable width. For example, as shown in FIG. 11, the width of the third region 8 can be slightly smaller than that of the first common electrode 2.

Figure 1:
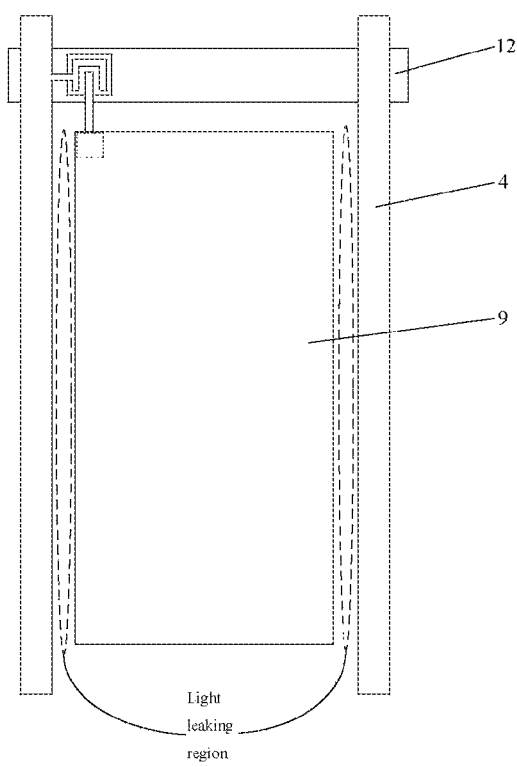
FIG. 1 schematically shows a plan view of a sub-pixel unit in the prior art, FIG. 2 schematically shows a data line volt profile when a complete black image is displayed, FIG. 3 schematically shows a structure of a cross-section of a liquid crystal panel when a voltage equivalent to the volt as shown in FIG. 2 is applied, FIG. 4 schematically shows a data line volt profile when a half-white/half-black image is displayed, FIG. 5 schematically shows a structure of a cross-section of a liquid crystal panel when a voltage equivalent to the volt as shown in FIG. 4 is applied, FIG. 6 schematically shows a cross section in a state when a black matrix and a sub-pixel unit are assembled under ideal conditions, FIG. 7 schematically shows a cross section in a state when a cross section of a black matrix and a sub-pixel unit are assembled in the prior art, FIG. 8 schematically shows a plan view in a state when between the black matrix and the sub-pixel unit are assembled as shown in FIG. 7, FIG. 9 schematically shows a plan view of a sub-pixel unit pair according to the present disclosure, FIG. 10 schematically shows a plan view in a state when a black matrix and a sub-pixel unit are assembled according to the present disclosure, and FIG. 11 schematically shows a further plan view in a state when a black matrix and a sub-pixel unit are assembled according to the present disclosure.
Figure 2:
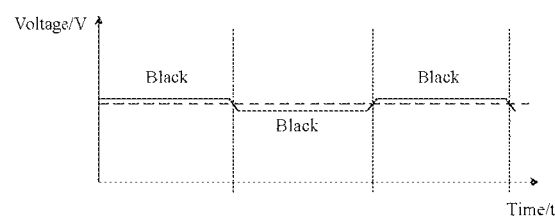
Figure 3:
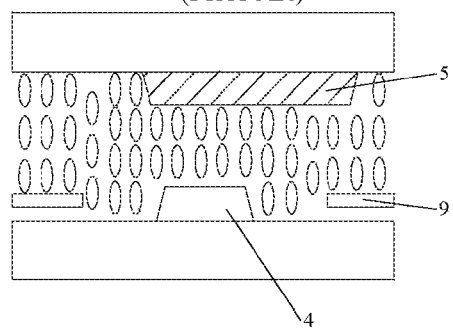
Figure 4:
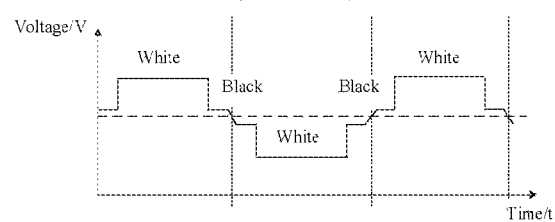
Figure 5:
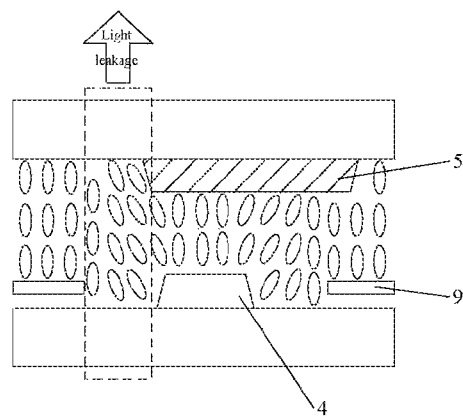
Figure 6:
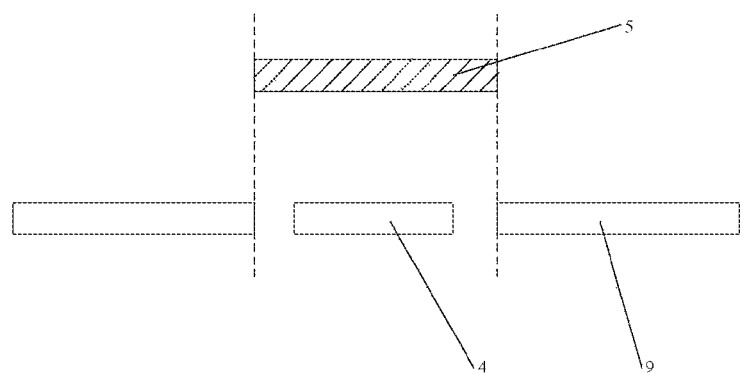
Figure 7:
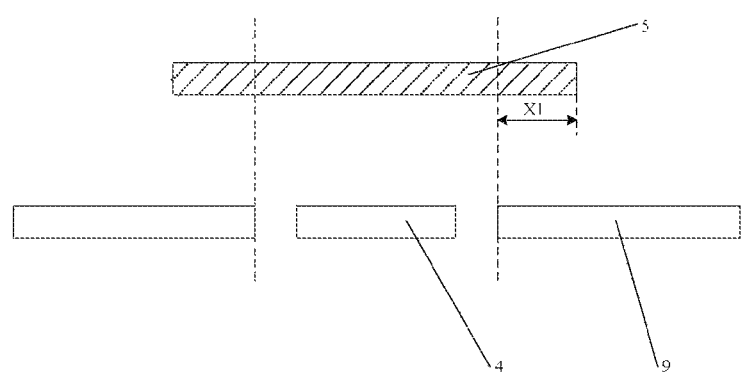
Figure 8:
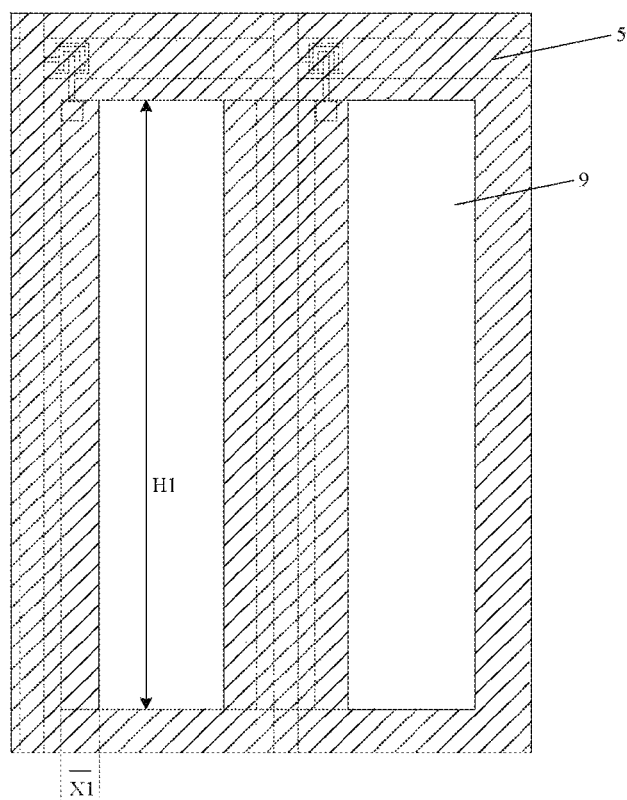

As shown in FIG. 10 and FIG. 11, in order to prevent the formation of a light-leaking region around the data line 4, the first region 6 corresponding to the data line 4 should extend toward a center of the sub-pixel unit 1 to such an extent that the first region 6 can partially cover the pixel electrode 9 of the sub-pixel unit 1. As shown in FIG. 10 or FIG. 11, a width of the part of sub-pixel unit 1 on a left side that is covered by the first region 6 and a width of the part of the right sub-pixel unit 1 on a right side that is covered by the first region 6 are the same, each being X. In an example according to the present disclosure, the width X of each of the parts of both sub-pixel units 1 that are covered by the first region 6 is in a range of 2-20 micrometers. Assumed that an effective height of the aperture region of the sub-pixel unit 1 is H, the area of the part of a single sub-pixel unit 1 that is blocked is X×H, which is reduced by half as compared with the blocked area 2×X×H of an existing sub-pixel unit 1 (as shown in FIG. 8). In this case, the aperture ratio of the sub-pixel unit 1 can be increased effectively.

Preferably, in order for a potential of the pixel electrode 9 to remain at a potential accessed from the data line 4, in an example according to the present disclosure, as shown in FIG. 9, pixel electrodes 9 of two sub-pixel units in a same sub-pixel unit pair each partially overlap the first common electrode 2, whereby a storage capacitance can be formed.

Further, as shown in FIG. 9, each sub-pixel unit 1 further comprises a second common electrode 10 that is parallel to the first common electrode 2 and located on the other side of the pixel electrode 9, the second common electrode 10 partially overlapping the pixel electrode 9 of the corresponding sub-pixel unit 1. As shown in FIG. 10 or FIG. 11, the second common electrode 10 and the data line 4 are both covered by the first region 6 of the black matrix 5, which will not bring any negative influence on the display effect of the display device.

Further, as shown in FIG. 11, the sub-pixel unit 1 further comprises a metal wiring 11 which connects the second common electrode 10 with the first common electrode 2. As shown in FIG. 11, one end of the metal wiring 11 is located at a middle section of the first common electrode 2, and the other end thereof is located at a middle section of the second common electrode 10. The metal wiring 11 is perpendicular to the first common electrode 2 and the second common electrode 10. Actually, the shape of the metal wiring 11 can be randomly arranged, e.g., it can be an inclined wiring which is not arranged horizontally, or a fold line-shaped wiring, or a wave line-shaped wiring, and the present example is not limited thereto. The location of the metal wiring 11 can also be randomly arranged, as long as the first common electrode 2 and the second common electrode 10 can be electrically connected. The present example does not limit the location of the metal wiring 11.

In addition, as shown in FIG. 9, the array substrate further comprises a plurality of gate lines 12 for providing driving signal to the sub-pixel unit 1. The plurality of gate lines 12 are perpendicular to data lines 4 and each are disposed between two rows of pixel units 1.

In an example according to the present disclosure, in order to simplify the manufacturing process of the array substrate, the first common electrode 2 and the second common electrode 10 may be located in the same layer as the gate lines 12, i.e., the first common electrode 2, the second electrode 10, and the gate lines 12 can be formed in a same patterning procedure. Furthermore, obviously, a potential of the first common electrode 2 or that of the second common electrode 10 differs from a potential of the gate lines 12. Therefore, the first common electrode 2 and the second common electrode 10 should be insulated with the gate line 12. For instance, the first common electrode 2 and the second common electrode 10 are separated from the gate line 12, so that the first common electrode 2 and the second common electrode 10 are insulated with the gate line 12.

Example 2

According to an example of the present disclosure, a display device is provided. Specifically, the display device comprises an array substrate according to example 1, and a color filter substrate coordinating with the array substrate.

Specifically, as shown in FIG. 10, the color filter substrate comprises a black matrix 5. The black matrix 5 comprises a first region 6 corresponding to data lines 4 of the array substrate, and a second region 7 adjoining the first region 6 and corresponding to the gate lines 12. In addition, as shown in FIG. 11, the color filter substrate further comprises a third region 8 corresponding to the first common electrode 2 of the array substrate. Since no data line 4 is disposed within the same sub-pixel unit pair, and the first common electrode 2 between the two sub-pixel units 1 of the same sub-pixel unit pair can shield light, a width of the third region 8 may not be limited.

In view of FIG. 10 and FIG. 11, in order to prevent the formation of light leaking regions around the data lines 4, the first region 6 corresponding to the data lines 4 should extend towards a center of the sub-pixel unit 1 for a portion, such that the first region 6 can partially cover a pixel electrode 9 of a corresponding sub-pixel unit 1. As shown in FIG. 10 or FIG. 11, a width of the part of the sub-pixel unit 1 on the left that is covered by the first region 6 equals to the width of a part of the sub-pixel unit 1 on the right that is covered by the region 6, each being X. In an example according to the present disclosure, a width of the pixel electrode 9 of the sub-pixel unit 1 that is covered by the first region 6 is in a range of 2-20 micrometers. Assumed that an effective height of the aperture region of the sub-pixel unit 1 is H, the area of a single sub-pixel unit 1 that is blocked is X×H, which is reduced by half as compared with the blocked area 2×X×H of an existing sub-pixel unit 1 (as shown in FIG. 8). In this case, the aperture ratio of the sub-pixel unit 1 is effectively increased.

In an example according to the present disclosure, the display device can be any product or component with display functions, including a liquid crystal panel, a liquid crystal television, a liquid crystal display device, a digital photo frame, a mobile phone, a tablet PC, and the like.

The above embodiments are described only for better understanding, rather than restricting, the present disclosure. Any person skilled in the art can make amendments to the implementing forms or details without departing from the spirit and scope of the present disclosure. The scope of the present disclosure should still be subject to the scope defined in the claims.

LIST OF REFERENCE SIGNS 1. sub-pixel unit
2. first common electrode
3. thin film transistor 4. data line
5. black matrix
6. first region
7. second region
8. third region
9. pixel electrode
10. second common electrode
11. metal wiring
12. gate line

The invention claimed is:

1. An array substrate, comprising a plurality of sub-pixel unit pairs, each sub-pixel unit pair comprising two adjacent sub-pixel units located in a same row, wherein two sub-pixel units in a same sub-pixel unit pair are mirror-symmetrical with respect to each other in structure, and a first common electrode forming an opaque region is arranged between said two sub-pixel units,
wherein each sub-pixel unit comprises a pixel electrode, and both pixel electrodes of two sub-pixel units in a same sub-pixel unit pair partially overlap the first common electrode,
wherein each sub-pixel unit further comprises a second common electrode that is parallel to the first common electrode, and located on an other side of the pixel electrode, the second common electrode partially overlapping the pixel electrode.

2. The array substrate according to claim 1, wherein each sub-pixel unit further comprises a thin film transistor located in a corner of the sub-pixel unit pair, and a data line is disposed between two adjacent sub-pixel units.

3. The array substrate according to claim 1, wherein sub-pixel unit further comprises a metal wiring which electrically connects the second common electrode with the first common electrode.

4. The array substrate according to claim 2, comprising a plurality of gate lines for providing drive signal to the thin film transistor of the sub-pixel unit, wherein the plurality of gate lines are perpendicular to the data lines, and each are disposed between two rows of pixel units, and the first common electrode and the gate lines are located on a same layer and insulated with each other.

5. A display device, comprising an array substrate and a color filter substrate associated with the array substrate,
wherein the array substrate comprises a plurality of sub-pixel unit pairs, each sub-pixel unit pair comprising two adjacent sub-pixel units located in a same row, and
wherein two sub-pixel units in a same sub-pixel unit pair are mirror-symmetrical with respect to each other in structure, and a first common electrode forming an opaque region is arranged between said two sub-pixel units,
wherein each sub-pixel unit comprises a pixel electrode, and both pixel electrodes of two sub-pixel units in a same sub-pixel unit pair partially overlap the first common electrode,
wherein each sub-pixel unit further comprises a second common electrode that is parallel to the first common electrode, and located on an other side of the pixel electrode, the second common electrode partially overlapping the pixel electrode.

6. The display device according to claim 5, wherein the color filter substrate comprises a black matrix, which comprises a first region corresponding to data lines of the array substrate, and a second region adjoining the first region and corresponding to gate lines of the array substrate.

7. The display device according to claim 6, wherein, the first region partially covers a pixel electrode of the sub-pixel unit.

8. The display device according to claim 7, wherein, a width of a part of the pixel electrode of the sub-pixel unit that is covered by the first region is in a range of 2-20 micrometers.

* * * * *